(12) United States Patent
Jagannathan et al.

(10) Patent No.: US 10,229,975 B2
(45) Date of Patent: Mar. 12, 2019

(54) FABRICATION OF SILICON-GERMANIUM FIN STRUCTURE HAVING SILICON-RICH OUTER SURFACE

(71) Applicant: International Business Machines Corporation, Armonk, NY (US)

(72) Inventors: Hemanth Jagannathan, Niskayuna, NY (US); ChoongHyun Lee, Rensselaer, NY (US); Shogo Mochizuki, Clifton Park, NY (US); Koji Watanabe, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/613,930

(22) Filed: Jun. 5, 2017

(65) Prior Publication Data
US 2018/0026100 A1  Jan. 25, 2018

Related U.S. Application Data

(63) Continuation of application No. 15/215,034, filed on Jul. 20, 2016, now Pat. No. 9,773,875.

(51) Int. Cl.
| | |
|---|---|
| *H01L 21/336* | (2006.01) |
| *H01L 29/165* | (2006.01) |
| *H01L 21/02* | (2006.01) |
| *H01L 21/762* | (2006.01) |
| *H01L 21/324* | (2006.01) |
| *H01L 29/10* | (2006.01) |

(Continued)

(52) U.S. Cl.
CPC ........ *H01L 29/165* (2013.01); *H01L 21/0217* (2013.01); *H01L 21/02271* (2013.01); *H01L 21/324* (2013.01); *H01L 21/762* (2013.01); *H01L 27/0886* (2013.01); *H01L 29/1037* (2013.01); *H01L 29/1041* (2013.01); *H01L 29/1054* (2013.01); *H01L 29/66795* (2013.01); *H01L 29/66818* (2013.01); *H01L 29/785* (2013.01)

(58) Field of Classification Search
CPC .............................................. H01L 21/823431
USPC .................................................. 438/284, 910
See application file for complete search history.

(56) References Cited

U.S. PATENT DOCUMENTS

| | | | |
|---|---|---|---|
| 7,022,593 | B2 | 4/2006 | Arena et al. |
| 7,629,220 | B2 | 12/2009 | Orlowski |

(Continued)

OTHER PUBLICATIONS

Disclosed Anonymously, "Complementary Metal-Oxide Semiconductor (CMOS) Fin-Shaped Field Effect Transistor (FinFET) with High Germanium (Ge) Content and Method for Fabricating the CMOS FinFET," ip.com, No. IPCOM000238188D, Aug. 7, 2014, 6 pages.

(Continued)

*Primary Examiner* — Chandra Chaudhari
(74) *Attorney, Agent, or Firm* — Vazken Alexanian; Ryan, Mason & Lewis, LLP

(57) ABSTRACT

A method includes forming an oxide layer on a silicon-germanium (SiGe) fin formed on a substrate. The first oxide layer comprises a mixture of a germanium oxide compound ($GeO_x$) and a silicon oxide compound ($SiO_x$). The first oxide layer is modified to create a Si-rich outer surface of the SiGe fin. A silicon nitride layer is deposited on the modified first oxide layer.

19 Claims, 4 Drawing Sheets

(51) Int. Cl.
*H01L 27/088* (2006.01)
*H01L 29/78* (2006.01)
*H01L 29/66* (2006.01)

(56) References Cited

U.S. PATENT DOCUMENTS

| | | |
|---|---|---|
| 7,705,345 B2 | 4/2010 | Bedell et al. |
| 8,828,850 B2 | 9/2014 | Cheng et al. |
| 8,957,476 B2 | 2/2015 | Glass et al. |
| 9,443,873 B1 | 9/2016 | Kerber et al. |
| 9,514,990 B2 * | 12/2016 | Liu ................ H01L 21/823431 |
| 2007/0221956 A1 | 9/2007 | Inaba |
| 2009/0166770 A1 | 7/2009 | Gluschenkov et al. |
| 2011/0018091 A1 | 1/2011 | Barth et al. |
| 2014/0008730 A1 | 1/2014 | Mitard et al. |
| 2015/0214333 A1 | 7/2015 | Colinge et al. |
| 2016/0035872 A1 | 2/2016 | Loubet et al. |
| 2016/0071933 A1 | 3/2016 | Maitrejean et al. |

OTHER PUBLICATIONS

Disclosed Anonymously, "Method and System for Fabricating a High-k/Metal Gate finFET CMOS by Simultaneously Forming Si-nFET and SiGe-pFET on a Semiconductor Substrate," ip.com, No. IPCOM000217323D, May 7, 2012, 6 pages.
List of IBM Patents or Patent Applications Treated as Related.

* cited by examiner

FABRICATION OF SILICON-GERMANIUM FIN STRUCTURE HAVING SILICON-RICH OUTER SURFACE

BACKGROUND

Semiconductor structures or devices may be embodied as field-effect transistors (FETs), such as metal-oxide-semiconductor FETs (MOSFETs). One or more such MOSFETs comprise an integrated circuit (IC or chip). A FinFET is a nonplanar MOSFET that may be built on a silicon substrate, such as a silicon-on-insulator (SOI) substrate. FinFETs may provide improved areal density and gate control of the conducting channel over planar MOSFETs.

SUMMARY

Illustrative embodiments of the invention provide techniques for fabricating improved semiconductor structures. While illustrative embodiments are well-suited to improve operation of FinFET structures, in particular, silicon-germanium FinFETs, alternative embodiments may be implemented with other types of semiconductor structures.

For example, in one illustrative embodiment, a method for fabricating a semiconductor structure comprises forming a first oxide layer on a silicon-germanium (SiGe) fin formed on a substrate. The first oxide layer comprises a mixture of a germanium oxide compound ($GeO_x$) and a silicon oxide compound ($SiO_x$). The first oxide layer is modified to create a Si-rich outer surface of the SiGe fin. A silicon nitride layer is deposited on the modified first oxide layer.

More particularly, in a further illustrative embodiment, the method for fabricating a semiconductor structure further comprises performing a shallow trench isolation (STI) process, with a silicon nitride layer protecting the SiGe fin during the STI process. In one example, performing the STI process comprises forming a second oxide layer on the silicon nitride layer and performing an annealing process on the second oxide layer for oxide densification. An improved semiconductor structure is thereby formed.

DETAILED DESCRIPTION

In illustrative embodiments, techniques are provided for transistor fabrication for implementation in a semiconductor structure. More particularly, illustrative embodiments provide techniques for fabricating silicon-germanium (SiGe) FinFETs. As will be explained in illustrative embodiments, such fabrication techniques advantageously reduce performance degradation by reducing, for example, Ge pile-up at the periphery and interference traps.

Furthermore, it is to be understood that embodiments discussed herein are not limited to the particular materials, features, and processing steps shown and described herein. In particular, with respect to formation (fabricating or processing) steps, it is to be emphasized that the descriptions provided herein are not intended to encompass all of the steps that may be used to form a functional integrated circuit device. Rather, certain steps that are commonly used in forming such devices are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount. However, other percent margins of error may be realized. Also, in the figures, the illustrated scale of one layer, structure, and/or region relative to another layer, structure, and/or region is not necessarily intended to represent actual scale.

FinFET fabrication methods have been developed to replace pure silicon (Si) fin structures, or fins, with silicon-germanium (SiGe) fins. As compared to forming the fins from pure Si, forming the fins from SiGe reduces threshold voltage (Vt), thereby increasing the current that flows through the channel. Additionally, SiGe fins provide for a higher carrier mobility than their pure Si fin counterparts.

FinFETs may be associated with a certain amount of off-state current leakage, which is current leakage that remains after the FinFET is turned "off". One component of the off-state leakage is punch-through leakage. If the off-state current leakage is not accounted for, a non-negligible off-leakage current density may be realized just below the channel bottom region of the FinFET.

Figure 1:
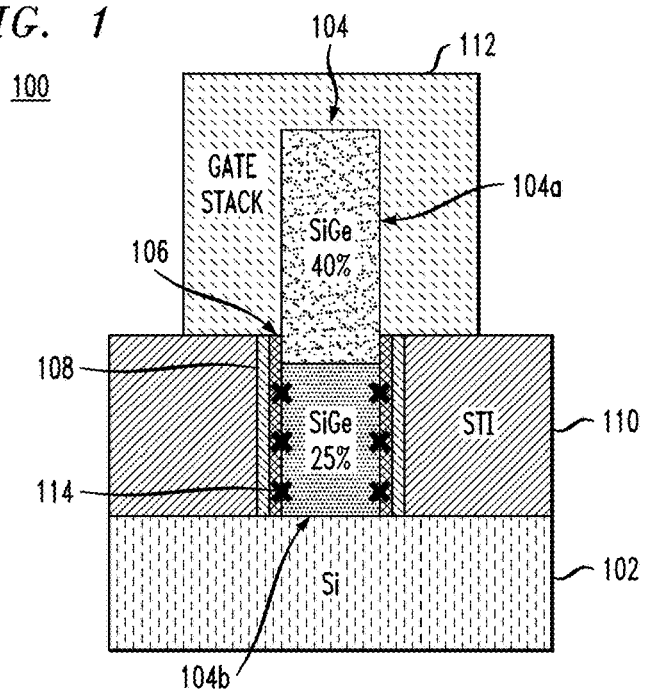
FIG. 1 is a schematic cross-sectional side view of a portion of a SiGe FinFET with which one or more embodiments of the invention will be described.

FIG. 1 illustrates a schematic cross-sectional side view of a portion of a SiGe FinFET 100. As shown, SiGe FinFET 100 includes a silicon (Si) substrate 102. Formed on substrate 102 is fin 104. As shown, fin 104 includes portion 104a and portion 104b. Portions 104a and 104b are each comprised of SiGe. For example, and as shown in this illustrative embodiment, portion 104a is associated with a 40% SiGe doping profile, and portion 104b is associated with a 25% SiGe doping profile. As is known, a SiGe doping profile is the percentage of dopant in the SiGe material (e.g., a fin portion that has a 40% SiGe doping profile means that the fin is comprised of a mixture of about 60% dopant and about 40% silicon-germanium).

Oxide layer 106 is formed on opposing sides of SiGe fin 104 and is further in contact with substrate 102. Oxide layer 106 is a passivation layer formed by the Si and Ge of fin 104 coming in contact with atmospheric oxygen. Oxide layer 106 may comprise a mixture of a silicon oxide ($SiO_x$) compound and a germanium oxide ($GeO_x$) compound. For example, oxide layer 106 may comprise a mixture of silicon dioxide ($SiO_2$) and germanium dioxide ($GeO_2$).

As further shown, silicon nitride layer 108 is formed on oxide layer 106 and in further contact with substrate 102. In one embodiment, silicon nitride layer 108 is comprised of silicon mononitride (SiN). A main function of silicon nitride layer 108 is to provide protection for fin 104 during one or more stages associated with a device isolation process. Device isolation may be used to prevent adjacent semiconductor components (e.g., separate transistors) from interacting with each other via the substrate. For example, device isolation may be used for preventing electric current leakage between SiGe FinFET 100 and one or more adjacent semiconductor devices. One such device isolation process is shallow trench isolation (STI). Accordingly, silicon nitride layer 108 protects fin 104 from one or more adverse effects that may occur due to one or more steps performed during a STI process.

A second oxide layer, oxide layer 110, is formed on silicon nitride layer 108 and in further contact with substrate 102. Oxide layer 110 is an oxidized STI liner formed by chemical vapor deposition (CVD) during the above-mentioned STI process. CVD is a chemical process used to produce conformal films and augment substrate surfaces. Generally, CVD is performed by exposing the substrate to one or more volatile precursors, which react and/or decompose on the substrate to produce the deposition. Any volatile by-products of the CVD process may be removed by gas flow through the reaction chamber used during the CVD process.

As further shown in FIG. 1, gate stack 112 is formed along fin 104. Gate stack 112 regulates the conductivity of SiGe FinFET 100 via voltage application to gate stack 112 (i.e., gate voltage). The applied gate voltage imposes an electric field into SiGe FinFET 100, thereby controlling the flow of charge carriers through the channel between a source terminal of fin 104 (not shown) and a drain terminal of fin 104 (not shown). The density of the charge carriers affects the conductivity between the source and the drain.

It is realized herein that an unwanted Ge pile-up at the SiGe FinFET periphery, denoted in FIG. 1 as Ge pile-up 114, is observed during the final stages of SiGe FinFET fabrication e.g., at the fin reveal process. This may be a root cause of high interface states resulting in degradation of SiGe FinFET device performance. The Ge pile-up at the SiGe FinFET periphery may come from the STI liner formation, which may be carried out at higher temperatures with in-situ steam generation (ISSG). In one example, the STI liner formation is carried out at a temperature of 850° C. Such a temperature is generally too high for SiGe FinFET oxide liners, which may cause the Si to be selectively oxidized due to a lower Gibbs free energy as compared to Ge. This high temperature oxidation may result in severe SiGe FinFET loss during the ISSG process. Additionally, a large number of interference traps at the bottom of the SiGe FinFET and STI liner may be a root cause of off-leakage current path and subthreshold swing degradation in SiGe FinFETs.

FIGS. 2A-2F illustrate an exemplary process of fabricating a semiconductor structure that addresses one or more of the aforementioned problems.

Figure 2A:
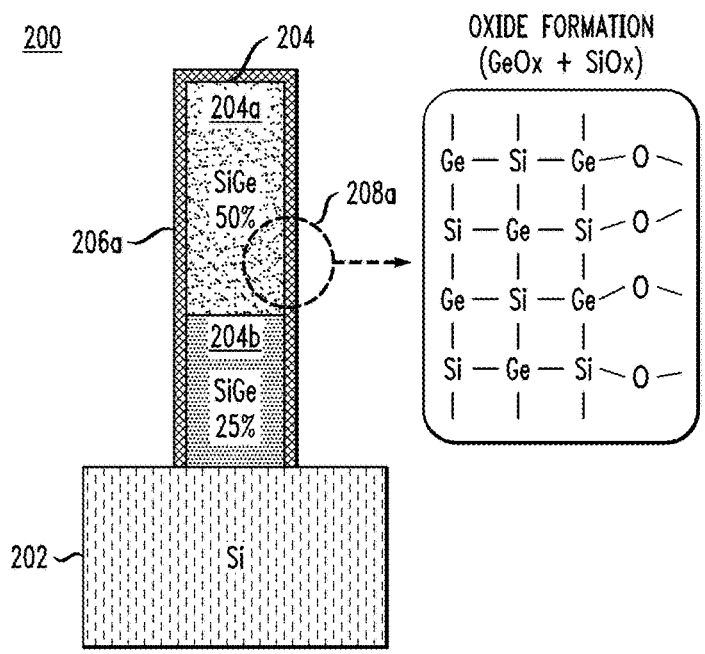
FIG. 2A is a schematic cross-sectional side view of a portion of a SiGe FinFET at a first-intermediate fabrication stage, according to an embodiment of the invention.

FIG. 2A illustrates a SiGe FinFET 200 at a first intermediate fabrication stage. For the purpose of clarity, several fabrication steps leading up to the production of the SiGe FinFET 200 as illustrated in FIG. 2A are omitted. In other words, the SiGe FinFET 200 does not necessarily start out in the form illustrated in FIG. 2A, but may develop into the illustrated structure over one or more well-known processing steps which are not illustrated but are well-known to those of ordinary skill in the art. Also, note that the same reference numeral (200) is used to denote the semiconductor structure (SiGe FinFET) through the various intermediate fabrication stages illustrated in FIGS. 2A through 2F. Note also that semiconductor structure 200 can also be considered to be a semiconductor device and/or an integrated circuit, or some part thereof.

SiGe FinFET 200 comprises a substrate 202. In one embodiment, substrate 202 is a silicon (Si) substrate. For example, substrate 202 may be a silicon-over-insulator (SOI) substrate. Fin 204 is formed on substrate 202. As shown, fin 204 includes portion 204a and portion 204b. In one embodiment, and as shown, portion 204a is associated with a 50% SiGe doping profile, and portion 204b is associated with a 25% SiGe doping profile. However, it is to be appreciated that the doping percentages provided herein are purely exemplary and are not to be considered limiting.

As shown in FIG. 2A, oxide layer 206a is formed on fin 204, similar to oxide layer 106 discussed above in the context of FIG. 1. Oxide layer 206a is an oxide comprised of a mixture of a germanium oxide compound ($GeO_x$) and a silicon oxide compound ($SiO_x$). In one embodiment, the germanium oxide compound is $GeO_2$, and the silicon oxide compound is $SiO_2$. Various oxidation methods that may be utilized in the formation of oxide layer 206a in accordance with the embodiments described herein are known in the art, such as thermal oxidation, ozone oxidation, plasma oxidation and radical oxidation. For example, in one embodiment, oxide layer 206a may be formed utilizing an ozone-rich deionized water solution (e.g., $DIO_3$). An exemplary zoom-in view 208a of fin 204 and oxide layer 206a is provided to further illustrate the formation of oxide layer 206a. Note that the chemical bonds toward the right side of view 208a represent the oxide layer 206a, while the chemical bonds toward the left side of view 208a represent fin 204.

Figure 2B:
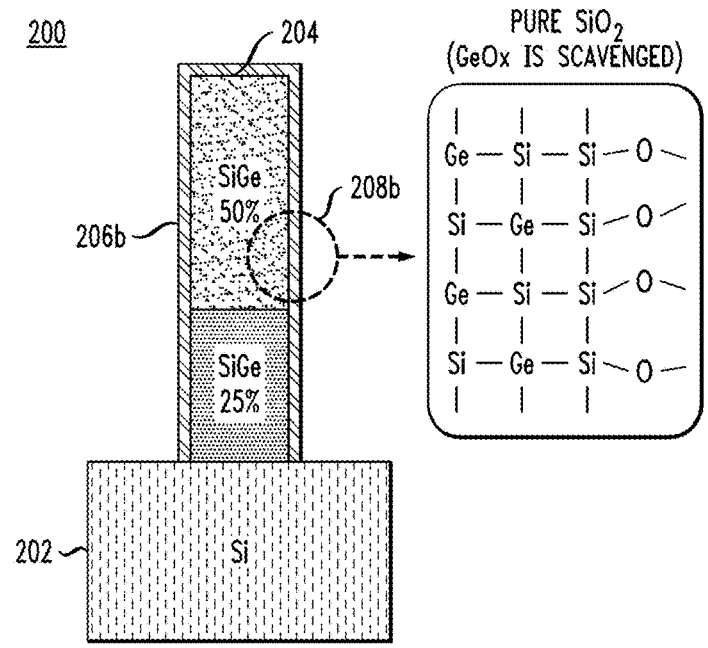
FIG. 2B is a schematic cross-sectional side view of a portion of a SiGe FinFET at a second-intermediate fabrication stage, according to an embodiment of the invention.

FIG. 2B illustrates SiGe FinFET 200 at a second intermediate fabrication stage. In this stage, oxide layer 206a from FIG. 2A is modified to create a Si-rich outer surface of fin 204. Specifically, oxide layer 206a is converted into oxide layer 206b by removing $GeO_x$ from oxide layer 206a leaving $SiO_x$, as illustrated by the exemplary zoom-in view 208b of fin 204 and oxide layer 206b. In one embodiment, removing the $GeO_x$ from oxide layer 206a comprises scavenging the $GeO_x$ via an annealing process. For example, the following reaction may occur with fin 204 and oxide layer 206a: $Ge+GeO_2 \rightarrow 2GeO$. This reaction results in the diffusion of GeO from the oxide layer 206a, i.e., GeO out-diffusion. The Ge atoms from the surface of fin 204 are consumed during the modification of oxide layer 206a to oxide layer 206b via GeO out-diffusion, thereby providing the Si-rich outer surface of fin 204.

As illustratively used herein, the term "Si-rich outer surface" may be defined as an outer surface depleted of Ge such that the outer surface is fully or at least predominantly comprised of Si. Note that the chemical bonds toward the right side of view 208b represent the oxide layer 206b, while the chemical bonds toward the left side of view 208b represent fin 204. Thereby, as will be illustrated further in FIG. 2F, fin 204 is considered to have an outer surface that is Si-rich (i.e., depleted of germanium, and fully or at least predominantly silicon). In one embodiment, oxide layer 206b has a thickness of about 10 Angstroms.

As is known in the art, an annealing process is a heat treatment process that increases the ductility of a material by altering physical and/or chemical properties of the material. A general annealing process may be carried out in a temperature range, for example, from about 260° C. to 760° C. In one embodiment, the annealing process employed herein is carried out at a temperature range from about 600° C. to 750° C. The high temperature utilized in the annealing process may result in oxidation of the surface of the material. To avoid unwanted oxidation, the annealing process may be carried out in a controlled atmosphere. In one embodiment, the annealing process may be carried out in a controlled atmosphere comprising an endothermic gas (i.e., a controlled atmosphere comprising one or more of carbon monoxide (CO), hydrogen gas ($H_2$) and nitrogen gas ($N_2$)). In another embodiment, the annealing process may be carried out in a dissociated ammonia atmosphere, which is a controlled atmosphere comprising a forming gas (i.e., a controlled atmosphere comprising a mixture of $H_2$ and $N_2$).

Figure 2C:
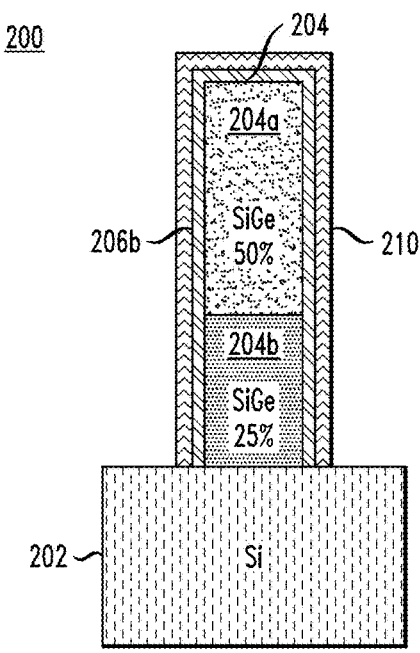
FIG. 2C is a schematic cross-sectional side view of a portion of a SiGe FinFET at a third-intermediate fabrication stage, according to an embodiment of the invention.

FIG. 2C illustrates SiGe FinFET 200 at a third intermediate fabrication stage. In this stage, silicon nitride layer 210 is deposited on the top of oxide layer 206b and in contact with substrate 202. For example, silicon nitride layer 210 may be comprised of silicon mononitride (SiN). In one embodiment, silicon nitride layer 210 has a thickness of about 45 Angstroms.

Figure 2D:
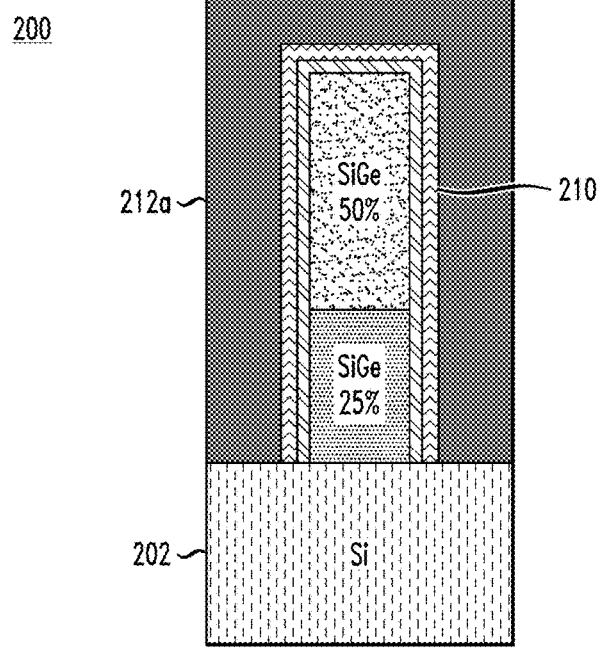
FIG. 2D is a schematic cross-sectional side view of a portion of a SiGe FinFET at a fourth-intermediate fabrication stage, according to an embodiment of the invention.

FIG. 2D illustrates SiGe FinFET 200 at a fourth intermediate fabrication stage. In this stage, oxide layer 212a is formed on the top of silicon nitride layer 210 and in contact with substrate 202. In one embodiment, oxide layer 212 functions as an STI liner, as discussed above with reference to FIG. 1. The formation of oxide layer 212a may take place in two stages. First, oxide layer 212a is deposited on the top of silicon nitride layer 210. In one embodiment, oxide layer 212a is deposited via a chemical vapor deposition (CVD) process, similar to the process discussed above in FIG. 1. Second, after oxide layer 212a is deposited, an annealing process may occur for oxide densification purposes. One function of silicon nitride layer 210 is to protect fin 204 during this annealing process.

Figure 2E:
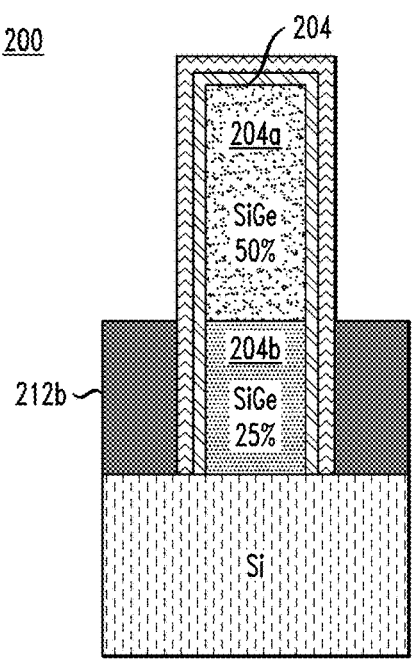
FIG. 2E is a schematic cross-sectional side view of a portion of a SiGe FinFET at a fifth-intermediate fabrication stage, according to an embodiment of the invention.

FIG. 2E illustrates SiGe FinFET 200 at a fifth intermediate fabrication stage. In this stage, oxide layer 212a from FIG. 2D is converted into oxide layer 212b by removing oxide layer 212a corresponding to first portion 204a of fin 204. In one embodiment, the removal of oxide layer 212a to form oxide layer 212b is performed via a chemical-mechanical planarization (CMP) process. Accordingly, oxide layer 212b is a recessed version of oxide layer 212a to expose the portion of silicon nitride layer 210 corresponding to portion 204a of fin 204.

Figure 2F:
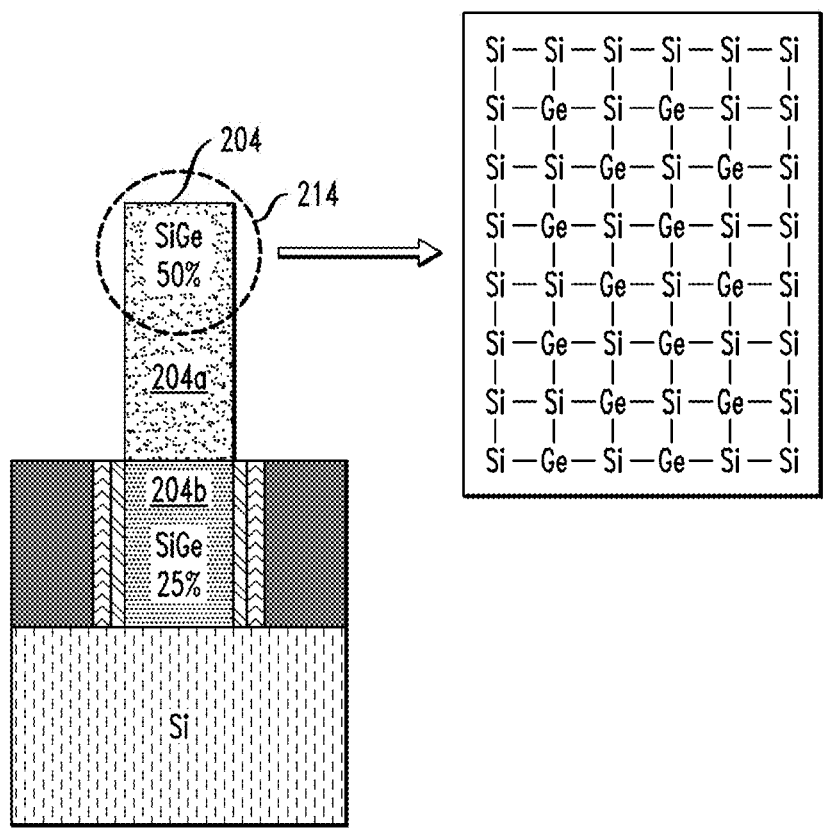
FIG. 2F is a schematic cross-sectional side view of a portion of a SiGe FinFET at a sixth-intermediate fabrication stage, according to an embodiment of the invention.

FIG. 2F illustrates SiGe FinFET 200 at a sixth intermediate fabrication stage. In this stage, portion 204a of fin 204 is revealed. Specifically, portion 204a of fin 204 is revealed by stripping the portion of silicon nitride layer 210 and the portion of oxide layer 206b corresponding to portion 204a of fin 204. An exemplary zoom-in view 214 of portion 204a of fin 204 is provided to further illustrate the result of the stages described above in FIGS. 2A-2F. As shown, the outer layer of portion 204a of fin 204 not interfacing with portion 204b of fin 204 is converted to a Si-rich layer, while the inner layers of portion 204a are comprised of SiGe Accordingly, a uniform profile throughout fin 204 is achieved.

Advantageously, illustrative embodiments reduce off-leakage currents in SiGe FinFETs. Having a Si-rich surface in the SiGe channel, as provided herein, is generally preferable to a surface having a high Ge concentration in order to reduce interference trap density. Additionally, fabricating a SiGe FinFET having a Si-rich surface without requiring conventional epitaxial deposition of Si provides advantages with respect to reliable gate stack formation. For example, the conventional epitaxial deposition of Si cannot be effectively controlled less than 1 nm on the fin structure of the SiGe FinFET, which affects deposition uniformity. The embodiments described herein provide for increased deposition uniformity over such conventional deposition methods.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for fabricating a semiconductor structure, comprising:
   forming a first oxide layer on sidewalls and a top surface of a silicon-germanium (SiGe) fin formed on a substrate, wherein the first oxide layer comprises a mixture of a germanium oxide compound and a silicon oxide compound;
   modifying the first oxide layer to form a Si-rich outer surface of the sidewalls and the top surface of the SiGe fin, wherein modifying the first oxide layer comprises removing the germanium oxide compound from the first oxide layer; and
   depositing a silicon nitride layer on the modified first oxide layer.

2. The method of claim 1, wherein the germanium oxide compound is $GeO_2$.

3. The method of claim 1, wherein the silicon oxide compound is $SiO_2$.

4. The method of claim 1, wherein the first oxide layer has a thickness of about 10 Angstroms.

5. The method of claim 1, wherein the silicon nitride layer has a thickness of about 45 Angstroms.

6. The method of claim 1, wherein forming the first oxide layer comprises utilizing one or more of thermal oxidation, ozone oxidation, plasma oxidation and radical oxidation.

7. The method of claim 1, wherein removing the germanium oxide compound from the first oxide layer comprises scavenging the germanium oxide compound from the first oxide layer via a first annealing process.

8. The method of claim 7, wherein the first annealing process is carried out at a temperature from about 600° C. to 750° C.

9. The method of claim 7, wherein the first annealing process is carried out in an atmosphere comprising at least one of an endothermic gas and a forming gas.

10. The method of claim 1, further comprising performing a shallow trench isolation (STI) process, wherein the silicon oxide layer protects the SiGe fin during the STI process.

11. The method of claim 10, wherein performing the STI process comprises forming a second oxide layer on the silicon nitride layer.

12. The method of claim 11, wherein forming the second oxide layer comprises depositing the second oxide layer via a chemical vapor deposition (CVD) process.

13. The method of claim 12, wherein forming the second oxide layer further comprises performing a second annealing process on the second oxide layer for oxide densification.

14. The method of claim 11, further comprising removing a portion of the second oxide layer corresponding to a first portion of the SiGe fin via a chemical-mechanical planarization (CMP) process.

15. The method of claim 14, wherein the first portion of the SiGe fin has a first doping profile and a second portion of the SiGe fin has a second doping profile.

16. The method of claim 15, wherein the first doping profile comprises about 50% SiGe.

17. The method of claim 16, wherein the second doping profile comprises about 25% SiGe.

18. The method of claim 14, further comprising revealing the first portion of the SiGe fin.

19. The method of claim 18, wherein revealing the first portion of the SiGe fin comprises stripping a portion of the silicon nitride layer and a portion of the first oxide layer corresponding to the first portion of the SiGe fin.

* * * * *